United States Patent
Kouki

(10) Patent No.: US 8,183,908 B2
(45) Date of Patent: May 22, 2012

(54) HIGH FREQUENCY SWITCHING CIRCUIT FOR REDUCING INSERTION LOSS AND RESTRICTING VARIATIONS IN HARMONIC LEVELS

(75) Inventor: Tanji Kouki, Yokohama (JP)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 49 days.

(21) Appl. No.: 12/271,390

(22) Filed: Nov. 14, 2008

(65) Prior Publication Data

US 2009/0160527 A1    Jun. 25, 2009

(30) Foreign Application Priority Data

Dec. 25, 2007    (JP) .................................. 2007-332361

(51) Int. Cl.
*H03K 17/687* (2006.01)

(52) U.S. Cl. ......................... 327/427; 327/434; 333/103

(58) Field of Classification Search .................. 327/427, 327/434; 333/101, 103
See application file for complete search history.

(56) References Cited

U.S. PATENT DOCUMENTS

| | | | | |
|---|---|---|---|---|
| 4,677,688 A | * | 6/1987 | Yoshihara et al. ............... 455/82 |
| 5,130,677 A | * | 7/1992 | Takai .......................... 333/22 R |
| 5,164,683 A | * | 11/1992 | Shields ......................... 330/307 |
| 5,594,394 A | * | 1/1997 | Sasaki et al. ................... 333/103 |
| 5,789,995 A | * | 8/1998 | Minasi .......................... 333/103 |
| 5,874,859 A | * | 2/1999 | Amachi et al. ................. 330/277 |
| 5,969,560 A | * | 10/1999 | Kohama et al. ................ 327/308 |
| 6,066,993 A | * | 5/2000 | Yamamoto et al. ........... 333/103 |
| 6,366,770 B1 | | 4/2002 | Seshita et al. |
| 6,504,449 B2 | * | 1/2003 | Constantine et al. ......... 333/103 |
| 6,693,498 B1 | * | 2/2004 | Sasabata et al. ............... 333/103 |
| 6,975,271 B2 | * | 12/2005 | Adachi et al. .......... 343/700 MS |
| 6,983,129 B2 | * | 1/2006 | Satoh et al. ....................... 455/82 |
| 7,084,708 B2 | * | 8/2006 | Sugiura et al. ................. 330/302 |
| 7,148,737 B2 | * | 12/2006 | Seshita et al. .................. 327/427 |
| 7,202,673 B1 | * | 4/2007 | Adlerstein .................... 324/655 |
| 7,215,205 B2 | * | 5/2007 | Kitlinski et al. ............... 330/307 |
| 7,221,207 B2 | * | 5/2007 | Fukumoto et al. ............ 327/365 |
| 7,265,604 B2 | * | 9/2007 | Yasuda et al. .................. 327/430 |
| 7,274,913 B2 | * | 9/2007 | Marholev et al. ............... 455/78 |
| 7,515,882 B2 | * | 4/2009 | Kelcourse et al. .............. 455/78 |
| 7,612,633 B2 | * | 11/2009 | Hangai et al. ................. 333/101 |
| 2005/0231439 A1 | | 10/2005 | Suwa et al. |

FOREIGN PATENT DOCUMENTS

JP    2005303940 A    10/2005
JP    2006-042138 A    2/2006

OTHER PUBLICATIONS

Korean Office Action for Application No. 10-2008-0054324, issued Jan. 28, 2010.

* cited by examiner

*Primary Examiner* — Kenneth B. Wells
(74) *Attorney, Agent, or Firm* — Lowe, Hauptman, Ham & Berner, LLP

(57) ABSTRACT

There is provided a high frequency switching circuit having good characteristics of high-order harmonics that has little variation. A high frequency switching circuit according to an aspect of the invention may include: a high frequency switch having one end connected to an input terminal receiving a high frequency signal and the other end connected to an output terminal of the high frequency signal, the high frequency switch turned on or off by a control signal; and a capacitor having a predetermined capacitance, and having one end connected the output terminal and the other end connected to a ground by a bonding wire.

16 Claims, 4 Drawing Sheets

HIGH FREQUENCY SWITCHING CIRCUIT FOR REDUCING INSERTION LOSS AND RESTRICTING VARIATIONS IN HARMONIC LEVELS

CROSS-REFERENCE TO RELATED APPLICATIONS

This application claims the priority of Japanese Patent Application No. 2007-332361 filed on Dec. 25, 2007, in the Japan Patent Office, the disclosures of which are incorporated herein by reference.

BACKGROUND OF THE INVENTION

1. Field of the Invention

The present invention relates to a high frequency switching circuit used to switch a transmission path of a high frequency signal in a mobile communication apparatus and a wireless LAN.

2. Description of the Related Art

In a mobile communication apparatus, such as a cellular phone, a transmission circuit and a reception circuit share one antenna. In general, a high frequency switching circuit for switching an antenna is provided between the antenna and the reception and transmission circuits. The high frequency switching circuit switches the antenna between the transmission circuit during the transmission and the reception circuit during the reception.

FIG. 4 is a view illustrating a high frequency switching circuit according to the related art, which is disclosed in Japanese Patent Laid-Open Publication No. 2006-042138. A high frequency switching circuit 10 includes high frequency switches 16 and 17 that are composed of semiconductor FETs. The high frequency switch 16 is connected between a transmission input terminal 11 and an antenna terminal 12. The high frequency switch 17 is connected between a reception input terminal 13 and an antenna terminal 12.

The high frequency switch 16 is turned on and the high frequency switch 17 is turned off during the transmission according to control signals applied to control terminals 14 and 15.

During reception, the high frequency switch 16 is turned off, and the high frequency switch 17 is turned on.

As shown in FIG. 4, a large-power amplifier 20, a filter 30, and a phase shifter 40 are connected to the transmission side of the high frequency switching circuit 10. A high frequency signal is supplied to the transmission input terminal 11.

The reception side receives the high frequency signal through a low noise amplifier 50 that is connected to the reception input terminal 13.

Further, an antenna 60 is connected to the antenna terminal 12.

In the high frequency switching circuit, a switch with low distortion to reduce high-order harmonics even when a large signal is input is required as a high frequency switch, especially for the high frequency switch 16 that is used in the transmission side.

In order to meet these needs, FETs forming the high frequency switches may be connected in multi stage or have a multi-gate structure, a boost circuit is provided to turn on or off the high frequency switches, or a feedback capacitor circuit is additionally provided to the high frequency switches. In this way, the high frequency switches with low distortion are implemented.

Even when the high frequency switches with low distortion are used, high-order harmonics caused by the high frequency switches are significantly changed due to the impedance of devices connected before and after the high frequency switches, such as an antenna, a filter, and an amplifier.

In the configuration disclosed in Japanese Patent Laid-Open Publication No. 2006-042138, shown in FIG. 4, a phase of the high frequency signal, which is input to the transmission input terminal 11, is adjusted by the phase shifter 40 provided at the transmission side of the high frequency switching circuit 10.

The phase or an electrical length of a connection line between the high frequency switching circuit 10, the large-power amplifier 20, and the filter 30 provided at the transmission side is adjusted to thereby optimize characteristics.

However, in the configuration of FIG. 4, inductances or capacitances in the phase shifter 40 need to be separately and individually adjusted for the optimization with respect to imbalanced impedance characteristics or kinds of individual devices connected to transmission input terminal 11, which increases manufacturing costs.

SUMMARY OF THE INVENTION

An aspect of the present invention provides a high frequency switching circuit having good characteristics of high-order harmonics that has little variation with various kinds of devices connected to a transmission side and a reception side of the high frequency switching circuit without requiring a phase shifter on the transmission side of the high frequency switching circuit.

According to an aspect of the present invention, there is provided a high frequency switching circuit including: a high frequency switch having one end connected to an input terminal receiving a high frequency signal and the other end connected to an output terminal of the high frequency signal, the high frequency switch turned on or off by a control signal; and a capacitor having a predetermined capacitance, and having one end connected the output terminal and the other end connected to ground by a bonding wire.

According to another aspect of the present invention, there is provided a high frequency switching circuit including: a high frequency switch having one end connected to an input terminal receiving a high frequency signal and the other end connected to an output terminal of the high frequency signal, the high frequency switch turned on or off by a control signal; a capacitor having a predetermined capacitance, and having one end connected the output terminal; and a pad electrode connected to ground by a bonding wire, and connected to the other end of the capacitor, opposite to the one end connected to the output terminal.

Therefore, a variation in harmonic level can be prevented by the circuit including the capacitor and the bonding wire when high-order harmonics are generated in response to the input of a large signal.

The capacitance of the capacitor and a wire length of the bonding wire may be controlled so that input and output impedances of the high frequency switch approximate a short circuit in a harmonic frequency band of the harmonic signal.

Here, since the input and output impedances of the switch approximate the short circuit in the frequency band of the harmonics, they are not affected by the impedance of an external circuit.

A resonance frequency of a resonance circuit including the capacitor and the bonding wire may be set to be higher than a high frequency of the high frequency signal.

The resonance frequency is set to be higher than the frequency of the high frequency signal, thereby reducing deterioration caused by insertion loss, and preventing a variation in high frequency level.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
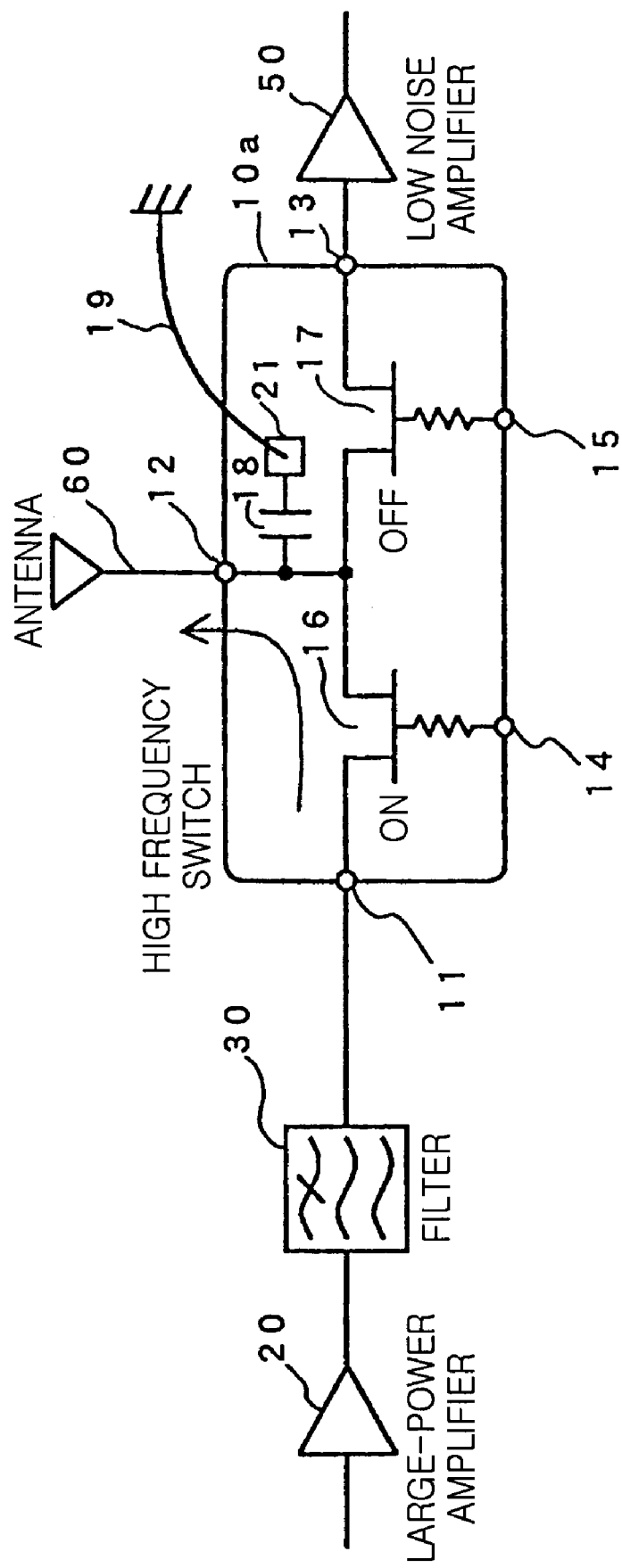
FIG. 1 is a view illustrating a configuration of a high frequency switching circuit according to an exemplary embodiment of the invention.

FIG. 1 is a view illustrating a configuration of a high frequency switching circuit according to an exemplary embodiment of the invention.

Figure 4:
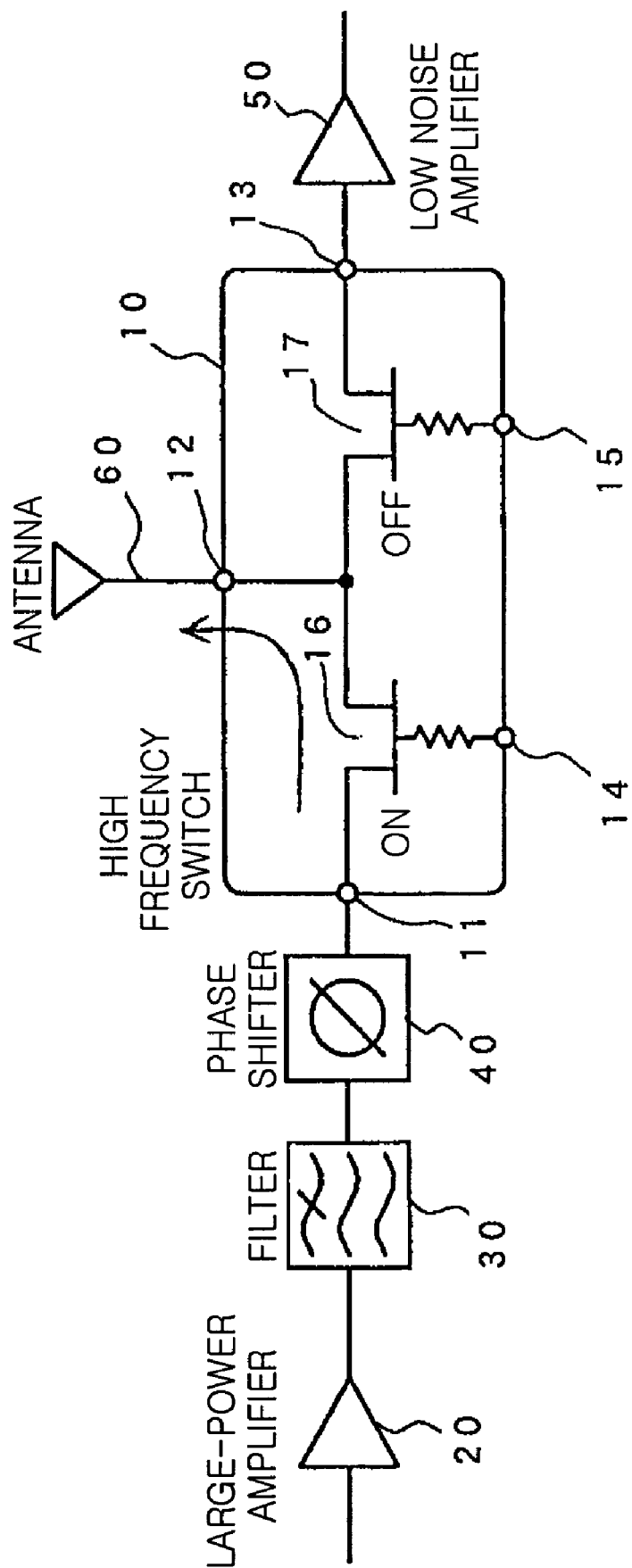
FIG. 4 is a view illustrating a configuration of a high frequency switching circuit according to the related art.

Like reference numerals denote like elements in the circuit configuration according to the related art, shown in FIG. 4, and a detailed description thereof will be omitted.

A high frequency switching circuit 10a according to this embodiment does not require the phase shifter 40 required in the related art. A capacitor 18 is mounted in the high frequency switching circuit, and has one end connected to an antenna terminal 12 and the other end connected to ground by a bonding wire 19.

A pad electrode 21 for grounding may be provided in the high frequency switching circuit 10a.

In general, high frequency switches 16 and 17 used in the high frequency switching circuit 10a produce high-order harmonics due to non-linear characteristics of the switches when a signal is input, which corresponds to undesirable radiation. Therefore, sufficient linearity is required according to a transmission output.

A large-power amplifier 20 and a filter 30 are connected to the transmission side of the high frequency switching circuit 10a. A low noise amplifier 50 is connected on the reception side, and an antenna 60 is connected to the antenna terminal 12 on the antenna side.

These devices match the determined characteristic impedance in a usable frequency band, but the impedance in a frequency band where high-order harmonics are doubled or tripled as compared with the usable frequency band is not ensured.

For this reason, a harmonic level is varied due to phase conditions of a transmission input terminal 11 between the high frequency switch 16 and the filter 30, the antenna terminal 12 between the high frequency switches 16 and 17 and the antenna 60, and the reception input terminal 13 between the high frequency switch 17 and the low noise amplifier 50.

Figure 2:
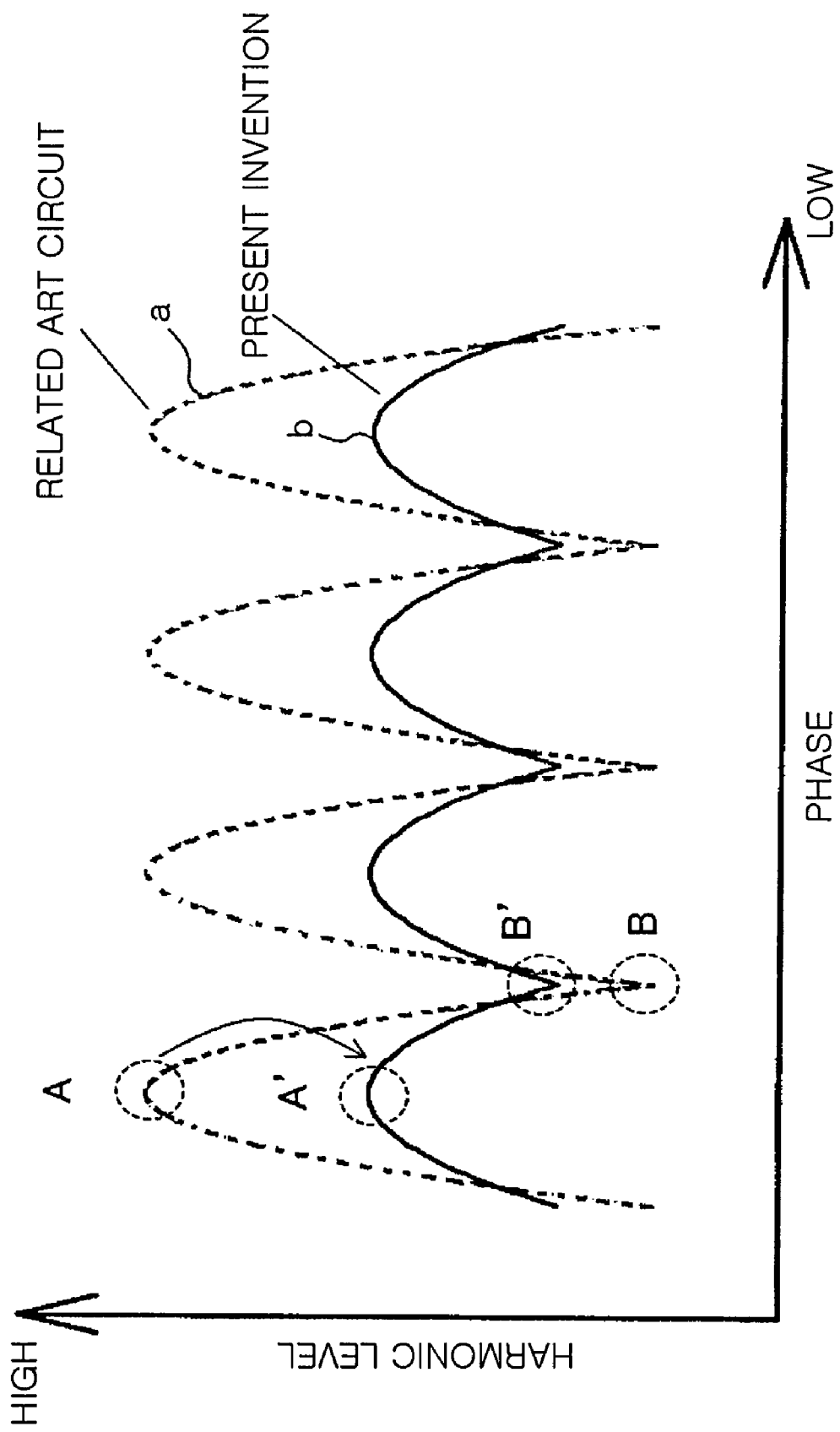
FIG. 2 is a view illustrating characteristics of a high frequency level with a phase variation between a circuit according to the related art and a circuit according to an embodiment of the invention.

FIG. 2 is a view illustrating a variation in harmonic level according to a phase. The variation in harmonic level caused by the circuit configuration according to the related art is indicated by a dashed line (a).

In the circuit according to the related art, shown in FIG. 4, in order that a harmonic level is reduced to the lowest point B, the phase shifter 40, shown in FIG. 4, is connected to the transmission input terminal 11, and phase adjustment is performed, so that the harmonic level is reduced to the point B.

However, in order to adjust the impedance with a frequency band that is not originally ensured, an adjustment process needs to be performed according to kinds of devices, and lots, which increases manufacturing costs.

In this embodiment of the invention, a simplified structure is added, that is, the capacitor 18 is mounted in the semiconductor, and has one end connected to the antenna terminal 12 and the other end connected to the ground by the bonding wire 19, such that the variation in harmonic level can be prevented as indicated by a solid line (b) in FIG. 2.

That is, while a maximum point of the harmonic level is reduced from A to A', and a minimum point is increased from B to B', the variation in harmonic level is reduced.

As such, in the high frequency switching circuit 10a according to this embodiment, stabilized high-order harmonic characteristics can be obtained even when any kind of device having any phase is connected to the transmission side, the reception side, and the antenna side. Further, the phase shifter 40, which is required in the related art, can be removed, and thus the time required for adjustment is not necessary.

Figure 3:
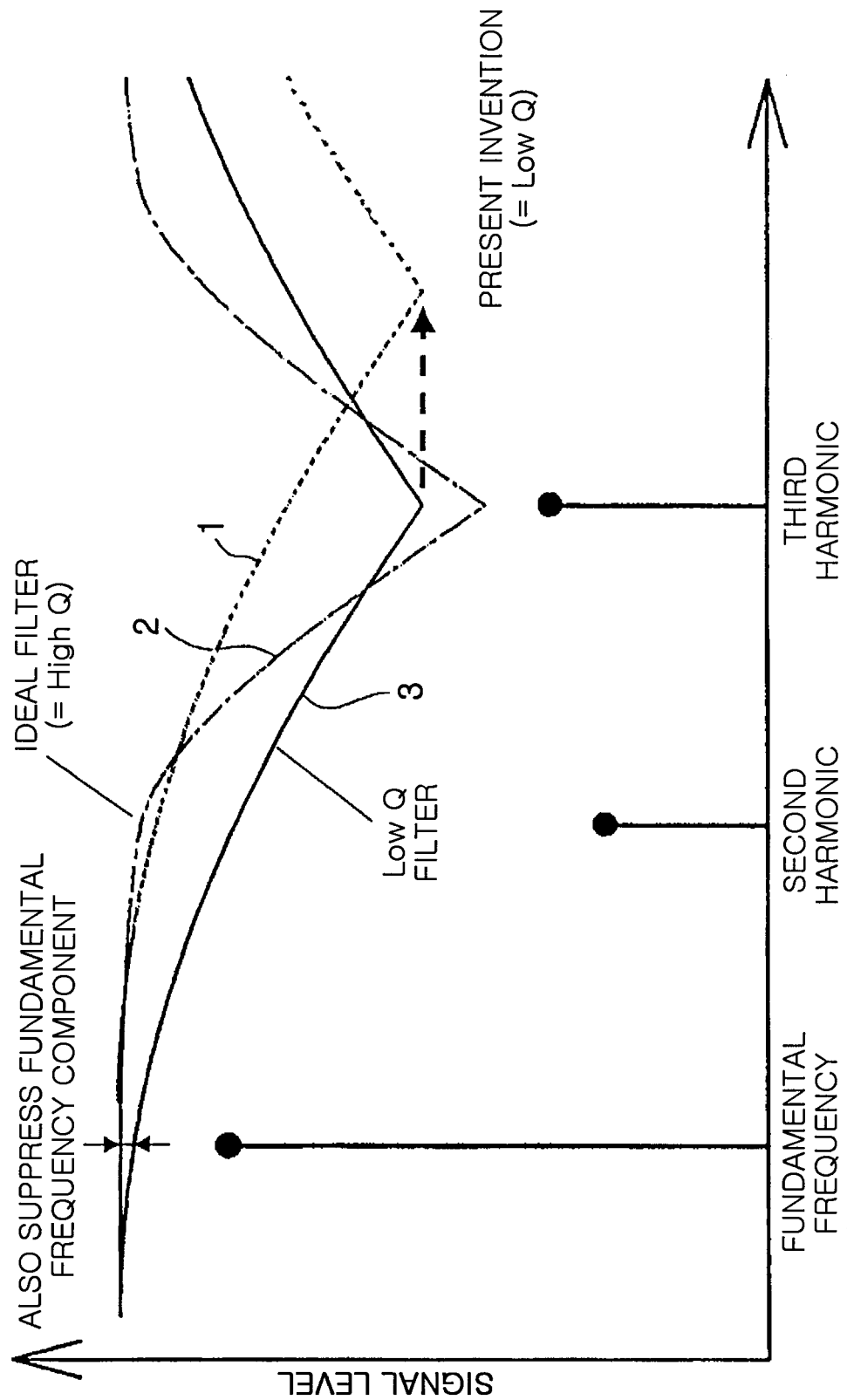
FIG. 3 is a view illustrating the relationship between the frequency of harmonics and a signal level.

FIG. 3 is a view illustrating an operation principle of the present invention. In FIG. 3, the relationship between a frequency and a signal level is shown.

According to the operation principle of the invention, by controlling length of the bonding wire 19 that serves as an inductor, input and output impedances of the switch in a frequency band of harmonics approximate a short circuit, and thus are hardly affected by external devices connected to the frequency switching circuit 10a.

Here, it is noted that the input and output impedances "approximate a short circuit". That is, when the impedance of a circuit including the capacitor 18 and the bonding wire 19 becomes a complete short circuit within a harmonic frequency band of the high frequency signal, the circuit serves as a band elimination filter (BEF) so as to suppress the harmonics, thereby improving harmonic characteristics. However, an LC resonance circuit including the capacitor 18 and the bonding wire 19 provided on the semiconductor has a low Q value, and even the impedance over the usable frequency band is also affected, which increases insertion loss.

For this reason, in this embodiment, the input and output impedances do not become a short circuit, but approximate the short circuit.

Specifically, a resonance frequency of the LC resonance circuit including the capacitor 18 and the bonding wire 19 is designed to be slightly higher than a harmonic frequency of the high frequency signal, thereby reducing the insertion loss and preventing a variation in harmonic level.

FIG. 3 is a characteristic view illustrating the relationship between a frequency and a signal level of a high frequency signal. In FIG. 3, a curve (1) shows characteristics in the embodiment, a curve (2) shows characteristics of an ideal filter in which the resonance circuit including the capacitor 18 and the bonding wire 19 has a high Q value, and a curve (3) shows characteristics of a low Q filter.

As described above, the filter of the resonance circuit including the capacitor 18 and the bonding wire 19 has characteristics as shown in the curve (3). For example, when it is designed that a resonance occurs in a third harmonic frequency, the signal level at the fundamental frequency component is also suppressed.

Therefore, in the embodiment of the invention, a resonance point is not set to be within the third harmonic frequency, but set to be higher than frequencies of harmonics, thereby preventing the suppression of the fundamental frequency components.

Further, in this embodiment, a resonance frequency of the resonance circuit including the capacitor and the bonding wire is set to be higher than a transmission point of the third harmonic. However, the invention is not limited to the third harmonic.

The input and output impedances of the high frequency switches may be adjusted to approximate the short circuit by adjusting the wire length of the bonding wire or by adjusting the capacitance of the capacitor.

As described above, exemplary embodiments of the invention include a high frequency switching circuit that further includes a circuit having a capacitor and a bonding wire on a semiconductor. The switching circuit exhibits good high-order harmonics characteristics of having little variation.

As set forth above, according to an exemplary embodiment of the invention, a switching circuit having good characteristics of high-order harmonics that has little variation with various kinds of devices connected to a transmission side or a reception side of the high frequency switching circuit can be implemented by adding a simplified circuit including a capacitor and a bonding wire on a semiconductor forming the high frequency switching circuit.

While the present invention has been shown and described in connection with the exemplary embodiments, it will be apparent to those skilled in the art that modifications and variations can be made without departing from the spirit and scope of the invention as defined by the appended claims.

What is claimed is:

1. A high frequency switching circuit comprising:
   a high frequency switch having a first end and a second end, the first end connected to an input terminal for receiving a high frequency signal, and the second end connected to an output terminal for transmitting the high frequency signal to an antenna, the high frequency switch configured to be turned on or off by a control signal; and
   a capacitor having a predetermined capacitance and two ends, one of the ends connected to the output terminal and configured to connect with the antenna directly, and the other one of the ends connected to ground by a bonding wire configured to function as an inductor, the capacitor and the bonding wire forming a series resonant circuit;
   wherein an impedance of the capacitor and a wire length of the bonding wire are configured to provide the high frequency switch with an output impedance of approximately a short circuit in a high frequency band of the high frequency signal.

2. The high frequency switching circuit accordingly to claim 1, wherein the resonance frequency of the resonance circuit is set to be a harmonic of the high frequency signal.

3. The high frequency switching circuit accordingly to claim 1, wherein the resonance frequency of the resonance circuit is set to be a non-harmonic of the high frequency signal.

4. The high frequency switching circuit accordingly to claim 1, wherein the high frequency switch comprises a transistor having a first source/drain terminal, a second source/drain terminal, and a gate terminal, the first source/drain terminal is connected to the input terminal, the second source/drain terminal is connected to the output terminal, and a gate terminal is connected to a control terminal and configured to receive the control signal.

5. A high frequency switching circuit comprising:
   a high frequency switch having a first end connected to an input terminal for receiving a high frequency signal and a second end connected to an output terminal for transmitting the high frequency signal to an antenna, the high frequency switch configured to be turned on or off by a control signal; and
   a capacitor having a predetermined capacitance and two ends, one end connected to the output terminal and configured to connect with the antenna directly, and the other end connected to ground by a bonding wire configured to function as an inductor, the capacitor and the bonding wire forming a series resonant circuit;
   wherein a resonance frequency of the resonance circuit is set to be higher than a frequency of the high frequency signal.

6. The high frequency switching circuit accordingly to claim 5, wherein the resonance frequency of the resonance circuit is set to be a harmonic of the high frequency signal.

7. The high frequency switching circuit accordingly to claim 5, wherein the resonance frequency of the resonance circuit is set to be a non-harmonic of the high frequency signal.

8. The high frequency switching circuit accordingly to claim 5, wherein the high frequency switch comprises a transistor having a first source/drain terminal, a second source/drain terminal, and a gate terminal, the first source/drain terminal is connected to the input terminal, the second source/drain terminal is connected to the output terminal, and a gate terminal is connected to a control terminal and configured to receive the control signal.

9. A high frequency switching circuit comprising:
   a high frequency switch having two ends, one of the ends connected to an input terminal for receiving a high frequency signal, and the other one of the ends connected to an output terminal for transmitting the high frequency signal to an antenna, the high frequency switch configured to be turned on or off by a control signal;
   a capacitor having a predetermined capacitance and a first end and a second end, the first end connected to the output terminal and configured to connect with the antenna directly; and
   a pad electrode connected to ground by a bonding wire configured to function as an inductor and connected to the second end of the capacitor, the capacitor and the bonding wire forming a series resonant circuit;
   wherein impedance characteristics of the capacitor and a wire length of the bonding wire are configured to provide the high frequency switch with an output impedance approximately to a short circuit in a high frequency band of the high frequency signal.

10. The high frequency switching circuit accordingly to claim 9, wherein the resonance frequency of the resonance circuit is set to be a harmonic of the high frequency signal.

11. The high frequency switching circuit accordingly to claim 9, wherein the resonance frequency of the resonance circuit is set to be a non-harmonic of the high frequency signal.

12. The high frequency switching circuit accordingly to claim 9, wherein the high frequency switch comprises a transistor having a first source/drain terminal, a second source/drain terminal, and a gate terminal, the first source/drain terminal is connected to the input terminal, the second source/ drain terminal is connected to the output terminal, and a gate terminal is connected to a control terminal and configured to receive the control signal.

13. A high frequency switching circuit comprising:

a high frequency switch having two ends, one of the ends connected to an input terminal for receiving a high frequency signal, and the other one of the ends connected to an output terminal for transmitting the high frequency signal to an antenna, the high frequency switch configured to be turned on or off by a control signal;

a capacitor having a predetermined capacitance and two ends, one end of the capacitor connected to the output terminal and configured to connect with the antenna directly; and a pad electrode connected to ground by a bonding wire configured to function as an inductor and connected to the second end of the capacitor, the capacitor and the bonding wire forming a series resonant circuit;

wherein a resonance frequency of the resonance circuit is set to be higher than a frequency of the high frequency signal.

14. The high frequency switching circuit accordingly to claim 13, wherein the resonance frequency of the resonance circuit is set to be a harmonic of the high frequency signal.

15. The high frequency switching circuit accordingly to claim 13, wherein the resonance frequency of the resonance circuit is set to be a non-harmonic of the high frequency signal.

16. The high frequency switching circuit accordingly to claim 13, wherein the high frequency switch comprises a transistor having a first source/drain terminal, a second source/drain terminal, and a gate terminal, the first source/drain terminal is connected to the input terminal, the second source/drain terminal is connected to the output terminal, and a gate terminal is connected to a control terminal and configured to receive the control signal.

* * * * *